(12) United States Patent
Niwa et al.

(10) Patent No.: US 8,466,822 B2
(45) Date of Patent: Jun. 18, 2013

(54) ANALOG-TO-DIGITAL CONVERSION APPARATUS AND SIGNAL PROCESSING SYSTEM

(75) Inventors: Atsumi Niwa, Kanagawa (JP); Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/352,615

(22) Filed: Jan. 18, 2012

(65) Prior Publication Data

US 2012/0194371 A1     Aug. 2, 2012

(30) Foreign Application Priority Data

Feb. 1, 2011    (JP) ................................ 2011-020003

(51) Int. Cl.
     *H03M 1/12*          (2006.01)

(52) U.S. Cl.
     USPC ............................ 341/155; 341/118; 341/156

(58) Field of Classification Search
     USPC .................................. 341/118, 143, 155, 156
     See application file for complete search history.

(56) References Cited

U.S. PATENT DOCUMENTS

| | | | | |
|---|---|---|---|---|
| 5,363,101 A | * | 11/1994 | Ueki | 341/143 |
| 7,289,054 B1 | * | 10/2007 | Watanabe | 341/156 |
| 7,330,144 B2 | * | 2/2008 | Terazawa et al. | 341/118 |
| 7,808,408 B2 | * | 10/2010 | Madisetti et al. | 341/118 |

* cited by examiner

*Primary Examiner* — Khai M Nguyen
(74) *Attorney, Agent, or Firm* — Rader, Fishman & Grauer PLLC

(57) ABSTRACT

An AD conversion apparatus includes: a first AD converter for converting an input analog signal into a first digital signal; a second AD converter for converting an analog signal obtained as a result of multiplying the input analog signal by a coefficient α into a second digital signal; a first computing unit for multiplying the first digital signal output by the first AD converter by $α^2$ obtained as a result of squaring the coefficient α; a second computing unit for multiplying the second digital signal output by the second AD converter by $α^{-1}$ which is the reciprocal of the coefficient α; and a third computing unit for computing a difference between a first computation result output by the first computing unit and a second computation result output by the second computing unit and outputting the difference as a result of AD conversion carried out on the input analog signal.

6 Claims, 7 Drawing Sheets

ANALOG-TO-DIGITAL CONVERSION APPARATUS AND SIGNAL PROCESSING SYSTEM

BACKGROUND

The present disclosure relates to an analog-to-digital (AD) conversion apparatus employed in mainly a receiving apparatus used in a radio communication in addition to audio equipment and medical measurement equipment and also relates to a signal processing system making use of the AD conversion apparatus.

FIG. 1 is a diagram showing a rough configuration of an AD converter (ADC) 1.

In FIG. 1, reference notation X denotes an input voltage supplied to the AD converter 1. The input voltage X is an analog signal. On the other hand, reference notation Y denotes an output voltage generated by the AD converter 1. The output voltage Y is a digital signal.

The AD converter 1 generates distortions caused by non-idealities of circuit components employed internally in the AD converter 1. When the circuit components generate distortions, the output voltage Y generated by the AD converter 1 includes not only the fundamental wave component, but also harmonic components.

The even-order distortion components included in the harmonic components can be sufficiently attenuated by designing the AD converter 1 into a fully differential configuration. However, the odd-order distortion components included in the harmonic components are output by the AD converter 1 as they are.

If the AD converter 1 shown in FIG. 1 has a distortion characteristic, for an input voltage X small to a certain degree, the output voltage Y is expressed by Eq. (1) as follows.

$$Y = a_1 X + a_3 X^3 + a_5 X^5 + \ldots \quad (1)$$

Reference notation $a_i$ used in the above equation denotes the gain of the distortion component of the ith order. It is obvious from the equation that the distortion components of the even order are not generated as described above.

SUMMARY

Since, in the case of normal harmonic distortion components, as the order increases, the gain decreases, the total distortion characteristic of AD converter is dominated by harmonic distortion components starting with the third-order harmonic distortion component.

This is because, as is obvious from Eq. (1), as the input voltage X increases, the distortion components each rise exponentially.

Thus, in the past, in order to improve the distortion characteristic, the input voltage X was limited to a small magnitude. In other words, the dynamic range of the ADC was limited by distortions.

The present disclosure provides an AD conversion apparatus capable of much improving the characteristic of the AD conversion whose dynamic range is limited by distortions and provides a signal processing system employing the apparatus.

An AD conversion apparatus according to a first form of a technology provided by the present disclosure includes:
a first AD converter configured to convert an input analog signal into a first digital signal;
a second AD converter configured to convert an analog signal obtained as a result of multiplying the input analog signal by a coefficient $\alpha$ into a second digital signal;
a first computing unit configured to multiply the first digital signal output by the first AD converter by $\alpha^2$ obtained as a result of squaring the coefficient $\alpha$;
a second computing unit configured to multiply the second digital signal output by the second AD converter by $\alpha^{-1}$ which is the reciprocal of the coefficient $\alpha$; and
a third computing unit configured to compute a difference between a first computation result output by the first computing unit and a second computation result output by the second computing unit and to output the difference as a result of AD conversion carried out on the input analog signal.

A signal processing system according to a second form of the technology provided by the present disclosure has an AD conversion apparatus configured to convert an input analog signal generated by an analog-signal processing system into an output digital signal. The AD conversion apparatus includes:
a first AD converter configured to convert the input analog signal into a first digital signal;
a second AD converter configured to convert an analog signal obtained as a result of multiplying the input analog signal by a coefficient $\alpha$ into a second digital signal;
a first computing unit configured to multiply the first digital signal output by the first AD converter by $\alpha^2$ obtained as a result of squaring the coefficient $\alpha$;
a second computing unit configured to multiply the second digital signal output by the second AD converter by $\alpha^{-1}$ which is the reciprocal of the coefficient $\alpha$; and
a third computing unit configured to compute a difference between a first computation result output by the first computing unit and a second computation result output by the second computing unit and to output the difference as a result of AD conversion carried out on the input analog signal.

In accordance with the technology provided by the present disclosure, it is possible to much improve the characteristic of AD conversion whose dynamic range is limited by distortions.

DETAILED DESCRIPTION OF THE PREFERRED EMBODIMENTS

Embodiments of the present disclosure are explained below by referring to the diagrams.

Figure 1:
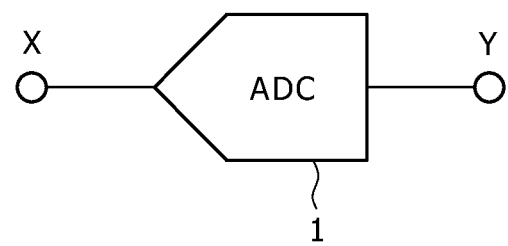
FIG. 1 is a diagram showing a rough configuration of an ADC (Analog to Digital Converter)
Figure 2:
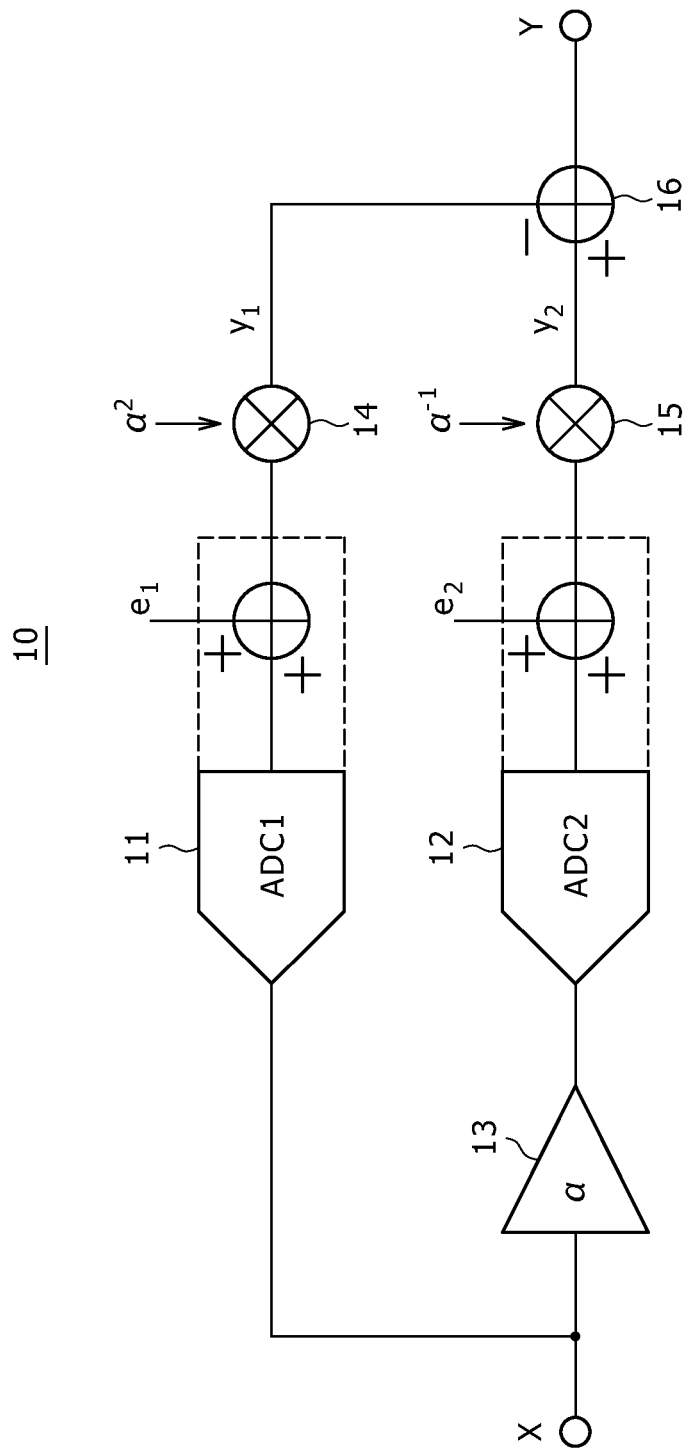
FIG. 2 is a diagram showing the configuration of an AD conversion apparatus having a distortion compensation function according to a first embodiment of the present disclosure.

It is to be noted that the embodiments of the present disclosure are explained in chapters arranged as follows:
1: First Embodiment
2: Second Embodiment
3: Third Embodiment
4: Fourth Embodiment 1: First Embodiment FIG. 2 is a diagram showing the configuration of an AD conversion apparatus 10 having a distortion compensation function according to a first embodiment of the present disclosure.

As shown in the figure, the AD conversion apparatus 10 according to this embodiment employs an ADC1 serving as a first AD converter 11, an ADC2 serving as a second AD converter 12, a gain multiplication circuit 13, a first multiplier 14, a second multiplier 15 and a subtractor 16.

The gain multiplication circuit 13 can be provided on the input side of the second AD converter 12.

The first multiplier 14 serves as a first computing unit, the second multiplier 15 serves as a second computing unit whereas the subtractor 16 serves as a third computing unit.

In FIG. 2, reference notation X denotes an input voltage supplied to the AD conversion apparatus 10. The input voltage X is an analog signal. On the other hand, reference notation Y denotes an output voltage generated by the AD conversion apparatus 10. The output voltage Y is a digital signal.

In this embodiment, the first AD converter 11 and the second AD converter 12 are AD converters having entirely the same characteristic. Reference notation $e_1$ denotes noise generated by the first AD converter 11 whereas reference notation $e_2$ denotes noise generated by the second AD converter 12.

The gain multiplication circuit 13 provided on the input side of the second AD converter 12 as described above multiplies the input voltage X at a gain a where $\alpha<1$. The gain multiplication circuit 13 is an analog circuit.

In this embodiment, the first AD converter 11 receives the input voltage X as it is. On the other hand, the second AD converter 12 receives a signal generated by the gain multiplication circuit 13 as a result of multiplying the input voltage X by the gain $\alpha$.

The first multiplier 14 multiplies a signal received from the first AD converter 11 by the square of the gain $\alpha$ in order to generate a signal y1 and supplies the signal y1 to the subtractor 16.

On the other hand, the second multiplier 15 multiplies a signal received from the second AD converter 12 by $1/\alpha$ in order to generate a signal y2 and supplies the signal y2 to the subtractor 16.

The subtractor 16 computes a difference between the signal y2 generated by the second multiplier 15 and the signal y1 generated by the first multiplier 14, outputting the difference as the output voltage Y of the AD conversion apparatus 10.

In the operations described above, both the first AD converter 11 and the second AD converter 12 exhibit an input/output transfer characteristic expressed by Eq. (1). Thus, if the noises $e_1$ and $e_2$ are not taken into consideration, the signal y1 generated by the first multiplier 14 and the signal y2 generated by the second multiplier 15 can be expressed by Eqs. (2) and (3) respectively as follows.

$$y_1 = \alpha^2 a_1 X + \alpha^2 a_3 X^3 \tag{2}$$

$$y_2 = a_1 X + \alpha^2 a_3 X^3 \tag{3}$$

It is to be noted that, in the case of Eqs. (2) and (3), only the dominant third-order distortion component of the distortion components is taken into consideration.

From Eqs. (2) and (3), the output voltage Y generated by the AD conversion apparatus 10 shown in FIG. 2 can be expressed by Eq. (4) which shows that the third-order distortion component is cancelled out.

$$Y = (1-\alpha^2) a_1 X \tag{4}$$

The signal component also decreases. However, the present technology provided by this embodiment is different from the existing technology in which a small input signal X is merely multiplied by $(1-\alpha^2)$ so that the output signal Y includes the third-order distortion component expressed by $a_3 (1-\alpha^2)^3 X$.

In the case of the technology provided by this embodiment, on the other hand, the third-order distortion component is cancelled out as described above.

In addition, noises are generated in the actual AD converter. Thus, if the noises $e_1$ and $e_2$ shown in FIG. 2 are generated, a noise $e_{out}$ appearing in the output voltage Y is expressed by Eq. (5) as follows.

$$e_{out} = \alpha^{-1} e_2 - \alpha^2 e_1 \tag{5}$$

As described above, the first AD converter 11 and the second AD converter 12 are AD converters having entirely the same characteristic. Thus, the noise $e_1$ generated by the first AD converter 11 also has the same power as the noise $e_2$ generated by the second AD converter 12, that is, $e_1 = e_2$. Taking the fact that $e_1 = e_2 = e$ into consideration, from Eqs. (4) and (5), the SNR (Signal to Noise Ratio) at the output of the AD conversion apparatus 10 can be expressed by Eq. (6) as follows.

$$SNR = \frac{Y}{e_{out}} = \frac{\alpha(1-\alpha^2)}{\sqrt{1+\alpha^6}} \cdot \frac{a_1 X}{e} \tag{6}$$

The SNR at the output of the AD conversion apparatus 10 for a case in which the input voltage X is supplied to the first AD converter 11 or the second AD converter 12 itself is $a_1 X/e$. It is obvious from Eq. (6) that this embodiment inadvertently deteriorates the SNR. For approximately $\alpha=0.55$, the SNR reaches a maximum value.

In the case of $\alpha$ expressed by 1/(power of two), on the other hand, the analog coefficient of a can be implemented with ease. In addition, the digital coefficient of $\alpha$ can also be implemented by a simple bit shift operation.

Thus, if the easiness of the implementation of the coefficient is taken into consideration, $\alpha=0.5$ ($=\frac{1}{2}$) is the most desirable coefficient. For $\alpha=0.5$, the deterioration of the SNR is about 8 dB.

2: Second Embodiment

Figure 3:
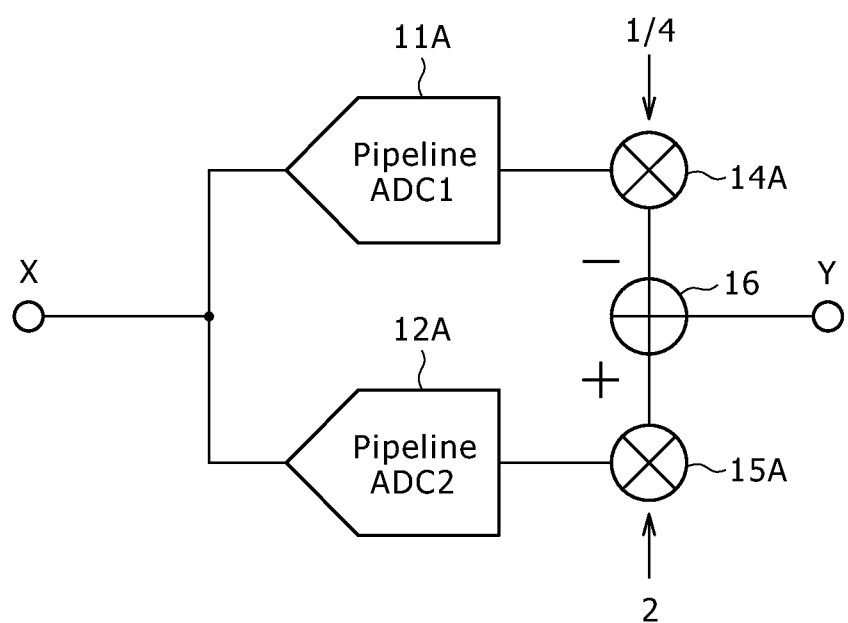
FIG. 3 is a diagram showing the configuration of an AD conversion apparatus having a distortion compensation function according to a second embodiment of the present disclosure.

FIG. 3 is a diagram showing the configuration of an AD conversion apparatus 10A having a distortion compensation function according to a second embodiment of the present disclosure.

The AD conversion apparatus 10A according to the second embodiment is different from the AD conversion apparatus 10 according to the first embodiment in that, a first AD converter 11A and a second AD converter 12A which are employed in the AD conversion apparatus 10A are both a pipeline AD converter.

Instead of multiplying the signal X supplied to the second pipeline AD converter 12A by a gain as is the case with the AD conversion apparatus 10, the magnitude of a signal supplied to a pipeline AD converter can be changed internally in the pipeline AD converter as will be described later.

As shown in FIG. 3, the AD conversion apparatus 10A according to the second embodiment employs an ADC1 serving as a first pipeline AD converter 11A, an ADC2 serving as a second pipeline AD converter 12A, a first multiplier 14A, a second multiplier 15A and a subtractor 16.

In the case of the second embodiment, the coefficient α used for eliminating distortion components is set at 0.5. Thus, the first multiplier 14A multiplies a signal output from the first pipeline AD converter 11A by ¼ whereas the second multiplier 15A multiplies a signal output from the second pipeline AD converter 12A by 2.

Figure 4:
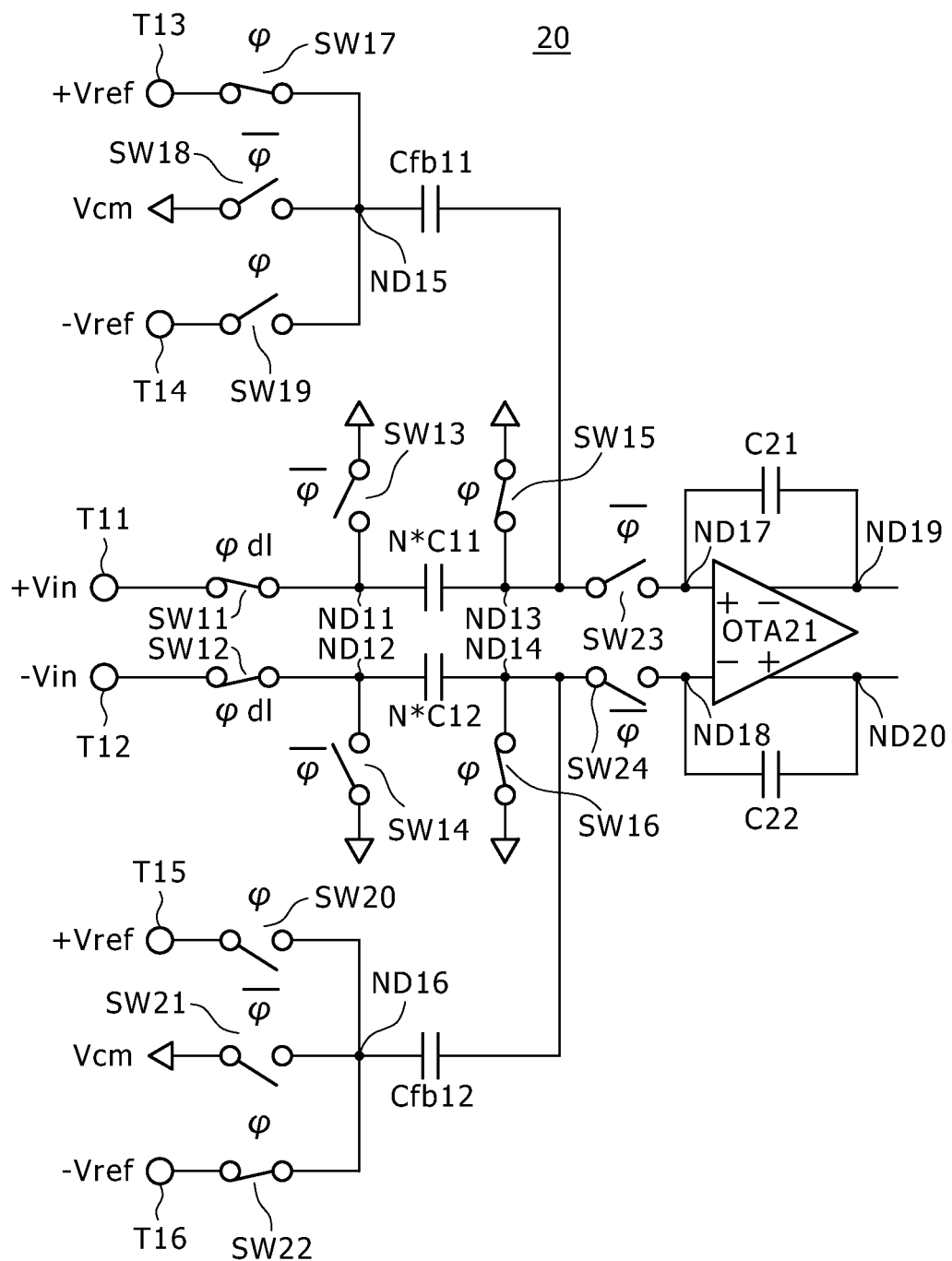
FIG. 4 is a circuit diagram showing a typical configuration of the input stage of each pipeline AD converter shown in FIG. 3.

FIG. 4 is a circuit diagram showing a typical configuration of an input-stage circuit 20 of the pipeline AD converter 11A or 12A shown in FIG. 3.

The input-stage circuit 20 shown in FIG. 4 employs an OTA (Operational Transconductance Amplifier) 21, capacitors C21 and C22 as well as sampling capacitors N*C11, N*C12, Cfb11 and Cfb12.

In addition, the input-stage circuit 20 also has a terminal T11 for receiving a differential input voltage Vin, a terminal T12 for receiving a differential input voltage −Vin, a terminal T13 for receiving a reference voltage Vref for the positive-side input voltage and a terminal T14 for receiving a reference voltage −Vref for the positive-side input voltage.

On top of that, the input-stage circuit 20 also has a terminal T15 for receiving the reference voltage Vref for the negative-side input voltage and a terminal T16 for receiving the reference voltage −Vref for the negative-side input voltage.

Furthermore, the input-stage circuit 20 also includes switches SW11 to SW24 as well as nodes ND11 to ND20.

The capacitor N*C11 is connected between the nodes ND11 and ND13 whereas the capacitor N*C12 is connected between the nodes ND12 and ND14.

The capacitor Cfb11 is connected between the nodes ND15 and ND13 whereas the capacitor Cfb12 is connected between the nodes ND16 and ND14.

The capacitor C21 is connected between the first input-side node ND17 of the operational transconductance amplifier OTA21 and the first output-side node ND19 of the operational transconductance amplifier OTA21 whereas the capacitor C22 is connected between the second input-side node ND18 of the operational transconductance amplifier OTA21 and the second output-side node ND20 of the operational transconductance amplifier OTA21.

The switch SW11 is connected between the input terminal T11 and the node ND11 and turned on and off by a signal Φd1 whereas the switch SW12 is connected between the input terminal T12 and the node ND12 and turned on and off by the signal Φd1.

The switch SW13 is connected between the node ND11 and a reference electric potential and turned on and off by the inverted signal/Φ of a signal Φ. Reference notation "/" indicates the inverted signal of a signal denoted by the signal reference notation.

The switch SW14 is connected between the node ND12 and the reference electric potential and turned on and off by the inverted signal/Φ of the signal Φ.

The switch SW15 is connected between the node ND13 and the reference electric potential and turned on and off by the inverted signal/Φ of the signal Φ.

The switch SW16 is connected between the node ND14 and the reference electric potential and turned on and off by the inverted signal/Φ of the signal Φ.

The switch SW17 is connected between the input terminal T13 and the node ND15 and turned on and off by the signal Φ.

The switch SW18 is connected between a common electric potential Vcm and the node ND15 and turned on and off by the inverted signal/Φ of the signal Φ.

The switch SW19 is connected between the input terminal T14 and the node ND15 and turned on and off by the signal Φ.

The switch SW20 is connected between the input terminal T15 and the node ND16 and turned on and off by the signal Φ.

The switch SW21 is connected between the common electric potential Vcm and the node ND16 and turned on and off by the inverted signal/Φ of the signal Φ.

The switch SW22 is connected between the input terminal T16 and the node ND16 and turned on and off by the signal Φ.

The switch SW23 is connected between the node ND13 and the node ND17 and turned on and off by the inverted signal/Φ of the signal Φ.

The switch SW24 is connected between the node ND14 and the node ND18 and turned on and off by the inverted signal /Φ of the signal Φ.

In the typical configuration shown in FIG. 4, the switches SW11, SW12, SW15, SW16, SW17 and SW22 have been put in a turned-on state.

With the switch SW15 put in a turned-on state, the capacitor N*C11 samples the input voltage Vin. With the switch SW15 put in a turned-off state, on the other hand, the capacitor N*C11 generates the sampled input voltage Vin on the node ND13, outputting a voltage signal representing the sampled input voltage Vin.

With the switch SW16 put in a turned-on state, the capacitor N*C12 samples the input voltage −Vin. With the switch SW16 put in a turned-off state, on the other hand, the capacitor N*C12 generates the sampled input voltage −Vin on the node ND14, outputting a voltage signal representing the sampled input voltage −Vin.

The capacitors Cfb11 and Cfb12 have the same function as the capacitors N*C11 and N*C12. To put it in detail, the capacitors Cfb11 and Cfb12 sample the sampled reference voltage Vref (or −Vref) or the common voltage Vcm, generating a voltage signal on the nodes N15 and ND16 respectively.

As described above, in the second embodiment, the first pipeline AD converter 11A and the second pipeline AD converter 12A adopt a technology for eliminating distortion components, and the coefficient α for eliminating the distortion components is set at 0.5.

In this case, it is necessary to multiply the analog input signal supplied to the second pipeline AD converter 12A by the coefficient α having a value of 0.5. However, the multiplication of the analog input signal supplied to the second pipeline AD converter 12A by the coefficient α having a value of 0.5 can be implemented with ease by setting the capacitances of the capacitors N*C11 and N*C12 serving as input components of the first pipeline AD converter 11A at values different from the capacitances of the capacitors N*C11 and N*C12 serving as input components of the second pipeline AD converter 12A shown in FIG. 4.

That is to say, in the first pipeline AD converter 11A, N is set at 2 (that is, N=2). In the second pipeline AD converter 12A, on the other hand, N is set at 1 (that is, N=1).

Since the coefficient α to be used as a multiplier of the signal supplied from each of the first and second pipeline AD converters 11A and 12A is set at 0.5 (that is, α=0.5), the value of $\alpha^2$ used by the first multiplier 14A on the output side of the first pipeline AD converter 11A is 0.25 (or ¼), that is, $\alpha^2$=0.25 (or ¼).

On the other hand, the value of $\alpha^{-1}$ used by the second multiplier 15A on the output side of the second pipeline AD converter 12A is 2, that is, $\alpha^{-1}$=2.

These multiplications can be implemented by bit-shift operations of digital codes output by the first pipeline AD converter 11A and the second pipeline AD converter 12A.

3: Third Embodiment

Figure 5:
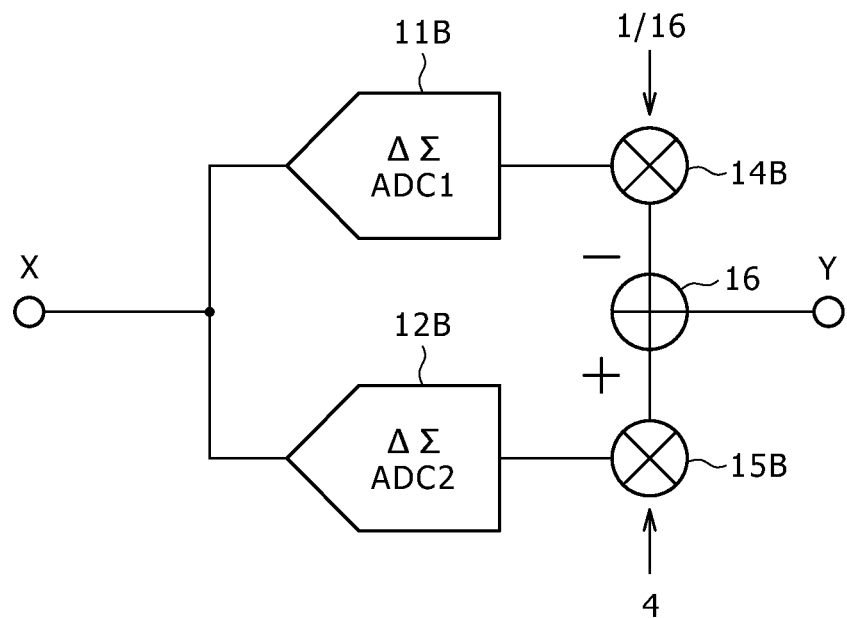
FIG. 5 is a diagram showing the configuration of an AD conversion apparatus having a distortion compensation function according to a third embodiment of the present disclosure.

FIG. 5 is a diagram showing the configuration of an AD conversion apparatus 10B having a distortion compensation function according to a third embodiment of the present disclosure.

The AD conversion apparatus 10B according to the third embodiment is different from the AD conversion apparatus 10 according to the first embodiment in that, in the case of the AD conversion apparatus 10B, a first AD converter 11B and a second AD converter 12B which are employed in the AD conversion apparatus 10B are both a ΔΣ AD converter of a continuous time system.

As shown in FIG. 5, the AD conversion apparatus 10B according to the third embodiment employs an ADC1 serving as a first ΔΣ AD converter 11B, an ADC2 serving as a second ΔΣ AD converter 12B, a first multiplier 14B, a second multiplier 15B and a subtractor 16.

In the case of the third embodiment, the coefficient α used for eliminating distortion components is set at 0.25. Thus, the first multiplier 14B multiplies a signal output from the first ΔΣ AD converter 11B by $\frac{1}{16}$ whereas the second multiplier 15B multiplies a signal output from the second ΔΣ AD converter 12B by 4.

Figure 6:
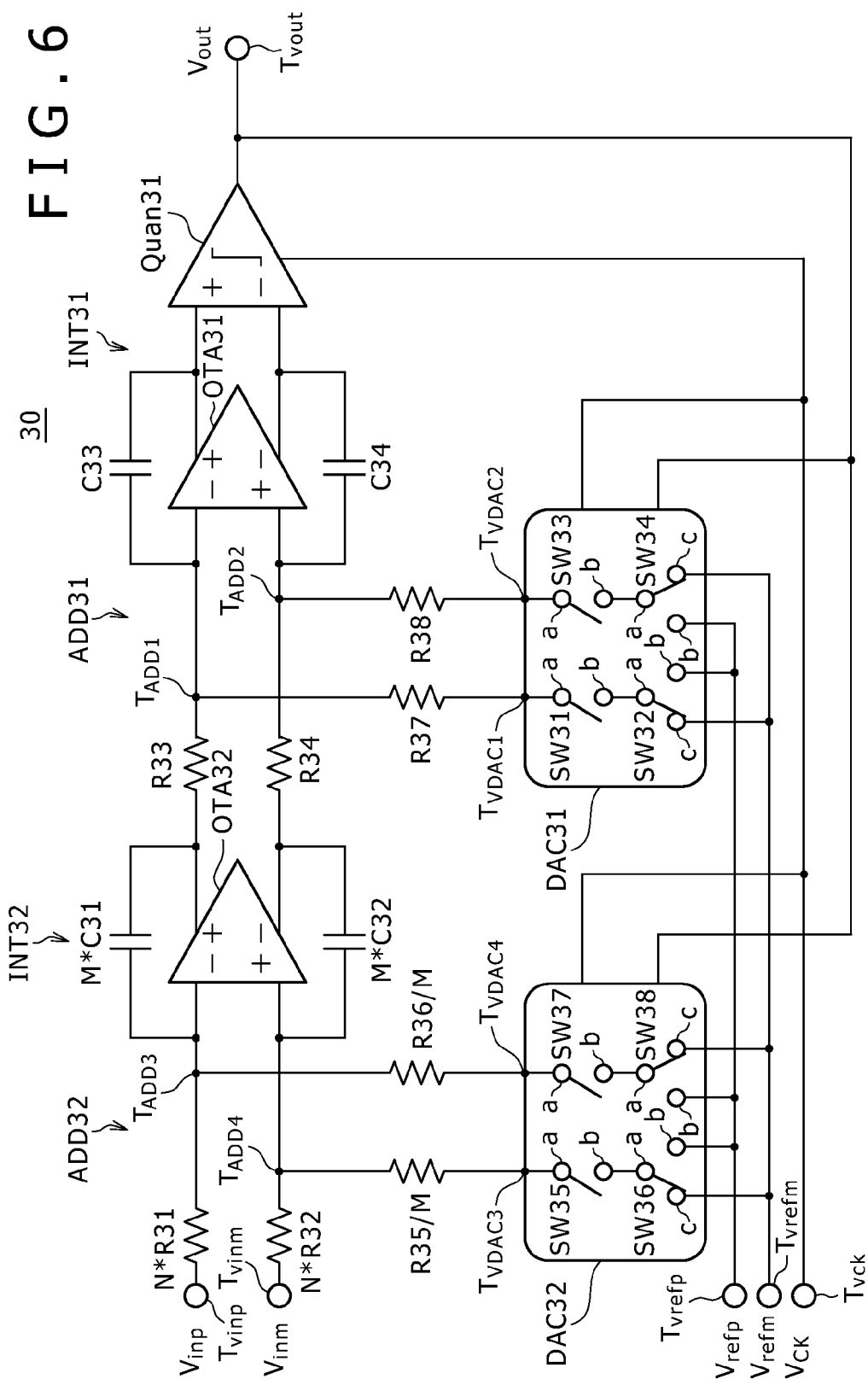
FIG. 6 is a circuit diagram showing a typical configuration of a delta-sigma ($\Delta\Sigma$) modulator serving as a $\Delta\Sigma$ AD converter shown in FIG. 5.

FIG. 6 is a circuit diagram showing a typical configuration of a ΔΣ modulator 30 serving as a ΔΣ AD converter employed in the AD conversion apparatus 10B shown in FIG. 5.

The ΔΣ modulator 30 shown in FIG. 6 is designed to function as a second-order 1-bit feedback ΔΣ modulator of a continuous time system.

The ΔΣ modulator 30 shown in FIG. 6 is configured to serve as a circuit for receiving differential input signals.

In FIG. 6, reference notation $V_{inp}$ denotes a positive-side analog input signal, reference notation $V_{inm}$ denotes a negative-side analog input signal, and reference notation $V_{out}$ denotes a digital output signal.

In addition, reference notation $V_{refp}$ denotes the positive reference voltage of a first digital-to-analog (DA) converter DAC31 and a second DA converter DAC32, reference notation $V_{refm}$ denotes the negative reference voltage of both DA converters, and reference notation Vck denotes a clock signal.

As shown in FIG. 6, the ΔΣ modulator 30 has a first analog signal input terminal $T_{Vinp}$, a second analog signal input terminal $T_{Vinm}$, a first reference voltage input terminal $T_{Vrefp}$, a second reference voltage input terminal $T_{Vrefm}$ and a clock input terminal $T_{Vck}$.

In addition, the ΔΣ modulator 30 also includes an input resistor N*R31, an input resistor N*R32 and a digital-signal output terminal $T_{Vout}$.

On top of that, the ΔΣ modulator 30 also employs a resistor R37 connected to the first output terminal $T_{VDAC1}$ of a first DA converter DAC31 and a resistor R38 connected to the second output terminal $T_{VDAC2}$ of the first DA converter DAC31.

Furthermore, the ΔΣ modulator 30 also employs a resistor R35/M connected to the first output terminal $T_{VDAC3}$ of a second DA converter DAC32 and a resistor R36/M connected to the second output terminal $T_{VDAC4}$ of the second DA converter DAC32.

Moreover, the ΔΣ modulator 30 also has a first adder ADD31, a resistor R33 and a resistor R34 which are provided at the output of a second integrator INT32.

In addition, the ΔΣ modulator 30 also has a second adder ADD32.

The first adder ADD31 includes a first terminal $T_{ADD1}$ at the connection point between the resistors R33 and R37 as well as a second terminal $T_{ADD2}$ at the connection point between the resistors R34 and R38.

On the other hand, the second adder ADD32 includes a third terminal $T_{ADD3}$ at the connection point between the resistors N*R31 and R36/M as well as a fourth terminal $T_{ADD4}$ at the connection point between the resistors N*R32 and R35/M.

The first integrator INT31 has a differential input/output operational transconductance amplifier OTA31, a capacitor C33 and a capacitor C34.

The negative-side input terminal (or the inverting input terminal −) of the operational transconductance amplifier OTA31 is connected to the first terminal $T_{ADD1}$ of the first adder ADD31 whereas the positive-side input terminal (or the non-inverting input terminal +) of the operational transconductance amplifier OTA31 is connected to the second terminal $T_{ADD2}$ of the first adder ADD31.

The positive-side output terminal of the operational transconductance amplifier OTA31 is connected to the positive-side input terminal of a quantizer Quan31 whereas the negative-side output terminal of the operational transconductance amplifier OTA31 is connected to the negative-side input terminal of the quantizer Quan31.

The capacitor C33 is connected between the negative-side input terminal of the operational transconductance amplifier OTA31 and the positive-side output terminal of the operational transconductance amplifier OTA31.

The capacitor C34 is connected between the positive-side input terminal of the operational transconductance amplifier OTA31 and the negative-side output terminal of the operational transconductance amplifier OTA31.

By the same token, the second integrator INT32 has a differential input/output operational transconductance amplifier OTA32, a capacitor M*C31 and a capacitor M*C32.

The negative-side input terminal (or the inverting input terminal −) of the operational transconductance amplifier OTA32 is connected to the third terminal $T_{ADD3}$ of the second adder ADD32 whereas the positive-side input terminal (or the non-inverting input terminal +) of the operational transconductance amplifier OTA32 is connected to the fourth terminal $T_{ADD4}$ of the second adder ADD32.

The positive-side output terminal of the operational transconductance amplifier OTA32 is connected to the resistor R33 whereas the negative-side output terminal of the operational transconductance amplifier OTA32 is connected to the resistor R34.

The capacitor M*C31 is connected between the negative-side input terminal of the operational transconductance amplifier OTA32 and the positive-side output terminal of the operational transconductance amplifier OTA32.

The capacitor M*C32 is connected between the positive-side input terminal of the operational transconductance amplifier OTA32 and the negative-side output terminal of the operational transconductance amplifier OTA32.

As shown in FIG. 6, the first DA converter DAC31 has switches SW31, SW32, SW33 and SW34.

The terminal a of the switch SW31 is connected to the first output terminal $T_{VDAC1}$ whereas the terminal b of the switch SW31 is connected to the terminal a of the switch SW32.

The terminal b of the switch SW32 is connected to the first reference voltage input terminal $T_{Vrefp}$ whereas the terminal c of the switch SW32 is connected to the second reference voltage input terminal $T_{Vrefm}$.

The terminal a of the switch SW33 is connected to the second output terminal $T_{VDAC2}$ whereas the terminal b of the switch SW33 is connected to the terminal a of the switch SW34.

The terminal b of the switch SW34 is connected to the first reference voltage input terminal $T_{Vrefp}$ whereas the terminal c of the switch SW34 is connected to the second reference voltage input terminal $T_{Vrefm}$.

By the same token, the second DA converter DAC32 has switches SW35, SW36, SW37 and SW38 as shown in FIG. 6.

The terminal a of the switch SW35 is connected to the third output terminal $T_{VDAC3}$ whereas the terminal b of the switch SW35 is connected to the terminal a of the switch SW36.

The terminal b of the switch SW36 is connected to the first reference voltage input terminal $T_{Vrefp}$ whereas the terminal c of the switch SW36 is connected to the second reference voltage input terminal $T_{Vrefm}$.

The terminal a of the switch SW37 is connected to the fourth output terminal $T_{VDAC4}$ whereas the terminal b of the switch SW37 is connected to the terminal a of the switch SW38.

The terminal b of the switch SW38 is connected to the first reference voltage input terminal $T_{Vrefp}$ whereas the terminal c of the switch SW38 is connected to the second reference voltage input terminal $T_{Vrefm}$.

As described above, the ΔΣ modulator 30 having the configuration shown in FIG. 6 is designed to function as a second-order 1-bit feedback ΔΣ modulator of a continuous time system and the first DA converter DAC31 plays the role of a second-stage feedback DA converter.

Each of the first DA converter DAC31 and the second DA converter DAC32 generates an output voltage synchronized to the clock signal Vck. The output voltages are determined by the level of the digital signal $V_{out}$ output by the ΔΣ modulator 30.

To be more specific, with the digital signal $V_{out}$ of the ΔΣ modulator 30 set at a high level, the negative-side reference voltage Vrefm is selected in order to drive the ΔΣ modulator 30 to carry out an operation to lower the digital signal $V_{out}$.

With the digital signal $V_{out}$ of the ΔΣ modulator 30 set at a low level, on the other hand, the positive-side reference voltage Vrefp is selected in order to drive the ΔΣ modulator 30 to carry out an operation to raise the digital signal $V_{out}$.

As described above, in the third embodiment, the first ΔΣ AD converter 11B and the second ΔΣ AD converter 12B adopt a technology for eliminating distortion components, and the coefficient α for eliminating the distortion components is set at 0.25.

The ΔΣ ADC is defined as a combination of a ΔΣ modulator and a digital circuit used as a decimation filter. A non-ideality causing distortion components and the like is generated by the block of the ΔΣ modulator.

The ΔΣ modulator 30 shown in FIG. 6 is configured to include a second-order loop filter including two integrators INT31 and INT32 each making use of a resistor and a capacitor, a comparator functioning as a 1-bit quantizer and a 1-bit DA converter for providing a feedback by changing a reference voltage by utilizing a switch.

It is necessary to provide the second ΔΣ AD converter 12B with a coefficient α set at 0.25, that is, α=0.25.

The equation α=0.25 can be implemented by setting the resistances/capacitances of components employed in the first ΔΣ AD converter 11B at values different from respectively the resistances/capacitances of the counterpart components employed in the second ΔΣ AD converter 12B. In this case, the components are the resistors N*R31 and N*R32 at the input stage or the integration capacitors M*C31 and M*C32 as well as the load resistors R36/M and R35/M connected to the second DA converter DAC32.

To put it concretely, the equation α=0.25 can be implemented with ease by setting N=1 and M=1 in the first ΔΣ AD converter 11B and N=4 or M=4 in the second ΔΣ AD converter 12B.

In addition, by carrying out a bit-shift operation in the same way as the second embodiment, the signal output by the first ΔΣ AD converter 11B can be multiplied with ease by a coefficient $α^2$ (=0.0625) whereas the signal output by the second ΔΣ AD converter 12B can be multiplied with ease by a coefficient $α^{-1}$ (=4).

The present disclosure provides to an AD conversion apparatus employed in mainly a signal receiving equipment used in a radio communication in addition to an audio equipment and a medical measurement equipment as an apparatus having the following effects.

By multiplying the input and output signals of two identical AD converters by proper coefficients and finding a difference between the signals output by the AD converters, it is possible to eliminate the third-order distortion component generated in the AD converters and, hence, much improve the characteristic of AD converter whose dynamic range is limited by distortions.

This technique provided by the present disclosure is particularly useful in the design of an AD converter to be operated by making use of a low power-supply voltage.

4: Fourth Embodiment

Figure 7:
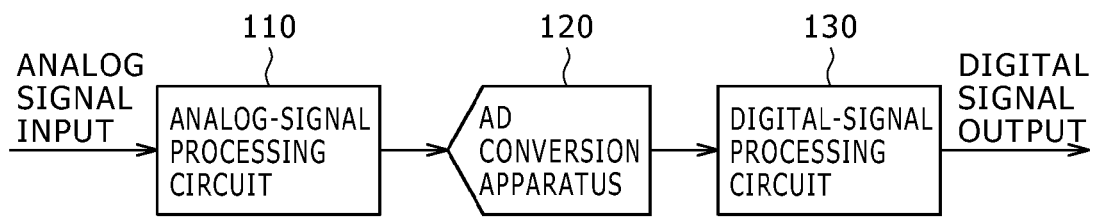
FIG. 7 is a block diagram showing a typical configuration of a signal processing system according to a fourth embodiment of the present disclosure.

FIG. 7 is a block diagram showing a typical configuration of a signal processing system 100 according to a fourth embodiment of the present disclosure.

The signal processing system 100 is a system to which the AD conversion apparatus 10, 10A and 10B according to the first, second and third embodiments respectively can be applied. The signal processing system 100 is employed typically in a receiver of communication equipment.

The signal processing system 100 is configured to include an analog-signal processing circuit 110, an AD conversion apparatus 120 and a digital-signal processing circuit 130.

The AD conversion apparatus 10, 10A or 10B according to the first, second or third embodiment respectively is used in the signal processing system 100 as the AD conversion apparatus 120.

In the signal processing system 100 shown in FIG. 7, as much signal processing as possible is carried out by the digital-signal processing circuit 130. Thus, the scale of the analog-signal processing circuit 110 can be reduced so that it is possible to decrease the size of the signal processing system 100 and increase the efficiency of the signal processing system 100.

In this case, in order to implement the signal processing system 100, that is, in order to carry out signal processing (which used to be performed by the analog-signal processing circuit 110) in the digital-signal processing circuit 130, it is necessary to convert the analog input signal into a digital signal without losing information conveyed by the original analog input signal. For this reason, the AD conversion apparatus 120 is required to have a high SNR (signal-to-noise ratio).

In order to implement a higher SNR, it is necessary to satisfy the following two conditions. In the first place, the resolution represented by the number of bits needs to be increased. In the second place, noises generated by the circuit must be reduced. In addition, the AD conversion apparatus is also required to be capable of carrying out AD conversion at a high speed. This is because the amount of information increases as the processing speed of a signal processing system is raised.

A typical example of the AD conversion apparatus 120 satisfying these conditions is the AD conversion apparatus 10A provided in accordance with the second embodiment to serve as an apparatus including the first pipeline AD converter 11A and the second pipeline AD converter 12A.

It is to be noted that either single operations or differential operations can be applied to the embodiments described above.

The present disclosure contains subject matter related to that disclosed in Japanese Priority Patent Application JP 2011-020003 filed in the Japan Patent Office on Feb. 1, 2011, the entire content of which is hereby incorporated by reference.

While preferred embodiments of the present disclosure have been described using specific terms, such description is for illustrative purpose only, and it is to be understood that changes and variations may be made without departing from the spirit or scope of the following claims.

What is claimed is:

1. An analog-to-digital conversion apparatus comprising:
a first analog-to-digital converter configured to convert an input analog signal into a first digital signal;
a second analog-to-digital converter configured to convert an analog signal obtained as a result of multiplying said input analog signal by a coefficient $\alpha$ into a second digital signal;
a first computing unit configured to multiply said first digital signal output by said first analog-to-digital converter by $\alpha^2$ obtained as a result of squaring said coefficient $\alpha$;
a second computing unit configured to multiply said second digital signal output by said second analog-to-digital converter by $\alpha^{-1}$ which is the reciprocal of said coefficient $\alpha$; and
a third computing unit configured to compute a difference between a first computation result output by said first computing unit and a second computation result output by said second computing unit and to output said difference as a result of analog-to-digital conversion carried out on said input analog signal.

2. The analog-to-digital conversion apparatus according to claim 1, wherein:
said first and second analog-to-digital converters are each created as a pipeline analog-to-digital converter including an input capacitor for sampling an input signal at the input stage; and
the capacitance of said input capacitor included in said first analog-to-digital converter is made different from the capacitance of said input capacitor included in said second analog-to-digital converter.

3. The analog-to-digital conversion apparatus according to claim 2, wherein
the capacitance of said input capacitor included in said second analog-to-digital converter is made smaller than the capacitance of said input capacitor included in said first analog-to-digital converter.

4. The analog-to-digital conversion apparatus according to claim 1, wherein:
said first and second analog-to-digital converters are each created as a delta-sigma analog-to-digital converter;
each of said delta-sigma analog-to-digital converters includes
at least one integrator with an integration capacitor,
a quantizer configured to quantize a signal output by said integrator in order to generate and output a digital signal,
at least one digital-to-analog converter configured to convert said digital signal generated by said quantizer into an analog signal and feed said analog signal back to the input side of said integrator through a load resistor, and
an input resistor configured to receive an input signal; and
the resistances of said load and input resistors included in said first analog-to-digital converter and the capacitance of said integration capacitor included in said first analog-to-digital converter are made different from respectively the resistances of said load and input resistors included in said second analog-to-digital converter and the capacitance of said integration capacitor included in said second analog-to-digital converter.

5. The analog-to-digital conversion apparatus according to claim 4, wherein
the resistances of said load and input resistors included in said second analog-to-digital converter and the capacitance of said integration capacitor included in said second analog-to-digital converter are made greater than respectively the resistances of said load and input resistors included in said first analog-to-digital converter and the capacitance of said integration capacitor included in said first analog-to-digital converter.

6. A signal processing system comprising
an analog-to-digital conversion apparatus for converting an input analog signal generated by an analog-signal processing system into an output digital signal, wherein said analog-to-digital conversion apparatus includes:
a first analog-to-digital converter configured to convert an input analog signal into a first digital signal;
a second analog-to-digital converter configured to convert an analog signal obtained as a result of multiplying said input analog signal by a coefficient $\alpha$ into a second digital signal;
a first computing unit configured to multiply said first digital signal output by said first analog-to-digital converter by $\alpha^2$ obtained as a result of squaring said coefficient $\alpha$;
a second computing unit configured to multiply said second digital signal output by said second analog-to-digital converter by $\alpha^{-1}$ which is the reciprocal of said coefficient $\alpha$; and
a third computing unit configured to compute a difference between a first computation result output by said first computing unit and a second computation result output by said second computing unit and to output said difference as a result of analog-to-digital conversion carried out on said input analog signal.

* * * * *